(12) United States Patent
Miyoshi

(10) Patent No.: US 6,358,772 B2
(45) Date of Patent: *Mar. 19, 2002

(54) SEMICONDUCTOR PACKAGE HAVING SEMICONDUCTOR ELEMENT MOUNTING STRUCTURE OF SEMICONDUCTOR PACKAGE MOUNTED ON CIRCUIT BOARD AND METHOD OF ASSEMBLING SEMICONDUCTOR PACKAGE

(75) Inventor: Tadayoshi Miyoshi, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/231,663

(22) Filed: Jan. 15, 1999

Related U.S. Application Data

(62) Division of application No. 09/070,932, filed on May 1, 1998, now Pat. No. 5,895,970.

(30) Foreign Application Priority Data

May 2, 1997 (JP) .............................................. 9-114831

(51) Int. Cl.$^7$ .............................................. H01L 21/44
(52) U.S. Cl. ...................................... 438/106; 257/696
(58) Field of Search ................................ 438/107, 108, 438/109, 106; 257/696

(56) References Cited

U.S. PATENT DOCUMENTS

| 3,294,988 | A |   | 12/1966 | Packard |
| 5,281,852 | A | * | 1/1994 | Normington ................. 257/685 |
| 5,714,405 | A | * | 2/1998 | Tsubosaki et al. ........... 437/206 |
| 5,817,540 | A | * | 10/1998 | Wark ........................... 438/107 |

FOREIGN PATENT DOCUMENTS

| JP | 59-96759 | 6/1984 |
| JP | 360016449 A | 1/1985 |
| JP | 4-109644 | 4/1992 |
| JP | 5-291361 | 11/1993 |
| JP | 7-78925 | 3/1995 |
| JP | 8-250545 | 9/1996 |

* cited by examiner

*Primary Examiner*—David Nelms
*Assistant Examiner*—David Vu
(74) *Attorney, Agent, or Firm*—McGinn &Gibb, PLLC

(57) ABSTRACT

The semiconductor package including a semiconductor element 11 having a first face 21a and a second face 21b which is opposite to the first face 21a, an electrode 22 provided on the first face 21a, and a conductive lead 23 connected to the electrode 22 comprises an insulating film member 24 provided on the second face 21b for connecting the other end of the lead, the lead 23 is bent as oppose to a side face of the semiconductor element 11, and is connected each other with an elastic force between the electrode 22 and the film member 24, a bent part of the lead between the electrode 22 and the film member 24 turns to be a terminal part 23a. The circuit board has a connection means, connecting to the terminal unit 23a, and having an adequate size for placing the semiconductor package 11. The connection means is constituted of an accommodation groove part 46 or a frame part 50, and a plurality of pattern electrodes 47a, 47b, and the terminal part 23a is connected between the pattern electrodes 47a, 47b.

20 Claims, 8 Drawing Sheets

SEMICONDUCTOR PACKAGE HAVING SEMICONDUCTOR ELEMENT MOUNTING STRUCTURE OF SEMICONDUCTOR PACKAGE MOUNTED ON CIRCUIT BOARD AND METHOD OF ASSEMBLING SEMICONDUCTOR PACKAGE

This Appln is a Div of Ser. No. 09/070,932, filed May 1, 1998 Pat. No. 5,895,970.

BACKGROUND OF THE INVENTION

1. Field of the Invention

The present invention relates to a semiconductor package mounted on a circuit board, a mounting structure of a semiconductor package for mounting the semiconductor package on the circuit board, and a method of assembling a semiconductor package.

2. Description of the Related Art

Conventionally, as a mounting system of a semiconductor element, a wire bonding system such as a tape carrier system is known. In general, as a tape carrier system, there is so called a TAB (Tape Automated Bonding). This TAB is used for a mounting to a micro-semiconductor package, and for a high density mounting with a multi-chip.

The TAB is such that a lead is formed on a film-like tape made of a polyimide film or a polyester film. A leading edge of the lead and a semiconductor element are joined by an Au-bump. The lead is formed from a Cu film plated with a Sn or an Au. An electrode of the semiconductor forms a bump on an Al pad plated with an Au and the like in a wafer stage. A semiconductor element bonding to the tape is adhered to a circuit board by a solder after having cut the lead at a predetermined location.

However, in the conventional mounting system of a semiconductor element, the KGD (Known Good Die) technology for sorting good/fault by a detection before mounting the semiconductor on the circuit board is difficult.

Further, an advanced technology is required for exchanging this semiconductor element after having mounted the semiconductor element on the circuit board.

Therefore, usually, when a fault has become clear as a result of having performed an examination after the semiconductor element has been mounted, it becomes a mounting technology which ruins an economical efficiency since the circuit board and the semiconductor element would be abandoned.

Also, in the TCP (Tape Carrier Package) technology to which the TAB is applied, it is possible to equip the circuit board with only a good article by an examination, but it is difficult to exchange the semiconductor element when it becomes necessary to update the semiconductor element later on.

SUMMARY OF THE INVENTION

It is an object of the present invention to provide a semiconductor package which implements a mounting with a high density, and facilitates an attachment to or a removal from a circuit board and enables to exchange quickly when a defective is found and/or when a necessity of updating is occurred.

It is another object of the present invention to provide a mounting structure of a semiconductor package which facilitates an attachment to or a removal from a circuit board, and also easily implements a lamination of one level or a multi-level on a circuit board of the same area.

It is yet another object of the present invention to provide a method of assembling a semiconductor package, which enables to perform an examination during an assembly process, and which is capable of sorting a good article, before equipping with the circuit board.

According to an aspect of the present invention, there is provided a semiconductor package comprising a semiconductor element having a first face, a second face opposite to the first face, and a side face extending between the first and the second faces, an electrode provided on the face; and a conductive lead having a first and a second end opposite to each other, the first end being conductively connected to the electrode, the second end being noncondutively connected to the second surface, the lead extending to the side face.

According to another aspect of the present invention, there is provided a mounting structure for use in mounting a semiconductor package on an circuit board, the semiconductor package including a semiconductor element having a first face, a second face opposite to the first face, and a side face extending between the first and the second faces, an electrode provided on the first face, and a conductive lead having a first and a second end opposite to each other, the first end being conductively connected to the electrode, the second end being noncondutively connected to the second surface, the lead extending to face the side face, the circuit board having a principal board surface, the mounting structure comprising a wiring pattern formed on said principal board surface; and connection means coupled to said circuit board for connecting said semiconductor package with said wiring pattern.

According to still another aspect of the present invention, there is provided a method of manufacturing a semiconductor package, comprising the steps of preparing a semiconductor package having a first and a second face opposite to each other; providing an electrode on the first face; preparing an nonconductive film member; connecting a conductive lead between the electrode and the film member in a condition in which the electrode and the film member are placed substantially on a common flat place; bending the lead to make the film member face the second face; and fixing the film member to the second face.

DESCRIPTION OF THE PREFERRED EMBODIMENTS

Prior to describing the concrete examples of the present invention, some conventional examples will be described concretely for assisting to understand the present invention.

Figure 1:
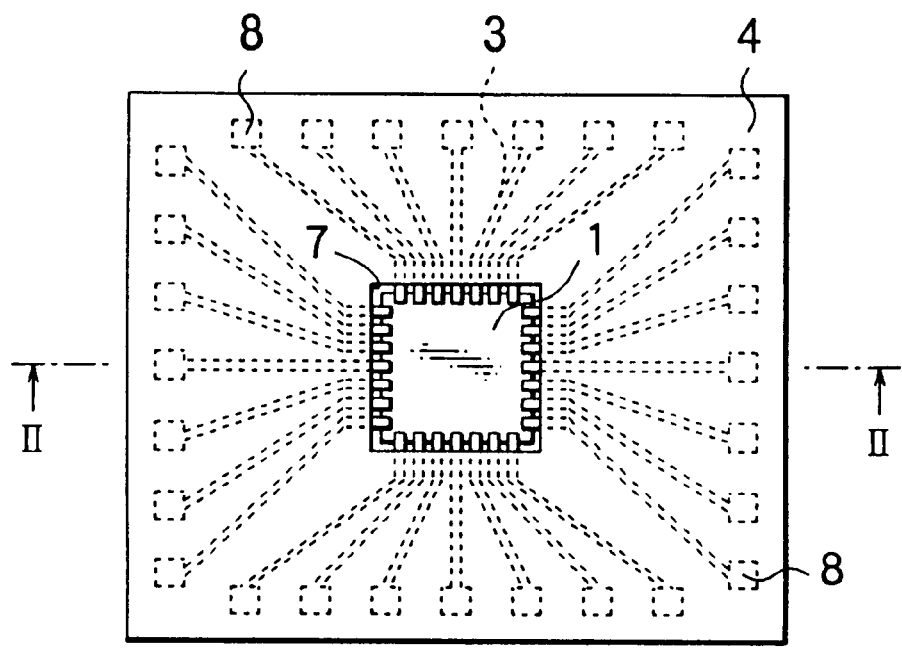
FIG. 1 is a plane view showing one example of a conventional semiconductor package.
Figure 2:
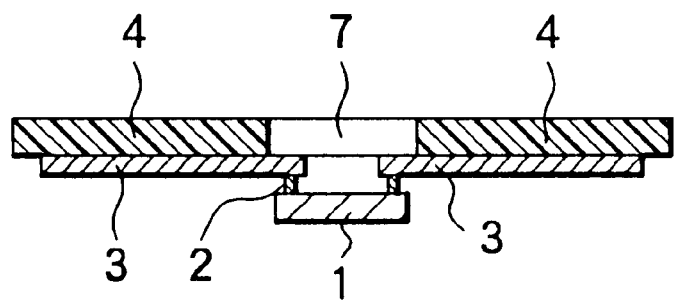
FIG. 2 is a cross-sectional view at the line II—II of FIG.

Referring to FIGS. 1 and 2, a semiconductor package produced by adopting a conventional TAB (Tape Automated Bonding) technology will be described. A semiconductor package includes a semiconductor element 1, a plurality of electrodes 2 connected to a circuit of this semiconductor element 1, a plurality of conductive leads 3 connected to the electrodes 2, and an insulating resin film 4 provided with the leads 3.

The film 4 is made of one of a polyimide resin, a glass epoxy resin, a phenol formaldehyde resin, or a polyester resin, with a thickness of about 0.1 mm.

In the center of the film 4, one device hole 7 for mounting the semiconductor element 1 is formed. The device hole 7 is formed in such a manner that a dimension of an external form thereof is much larger than an external form of the semiconductor element 1.

The Cu lead 3 with a thickness of about 30 micrometers is provided on the film 4. One-end units of the plurality of leads 3 extend into the device hole 7. On a surface of the lead 3, a treatment of Au plating or a solder plating is made on a plating which is made of Si plating or Ni plating and the likes. The one-end units of the plurality of leads 3 extending into the device hole 7 and the plurality of electrodes 2 of the semiconductor element 1 are connected one-by-one. The connections such as these are called as the ILB (Inner Lead Bonding). A conductive pad 8 for use in an examination is provided at the other-end units of the plurality of leads 3 on the film 4.

However, as described above, in the mounting system of the semiconductor package, a technology for sorting a defective is difficult. Further, as a result of the examination, when the defective becomes clear, there is a problem which ruins an economical efficiency since the circuit board and the semiconductor element would be abandoned.

Also, in case of TCP (Tape Carrier Package) to which the TAB is applied, it is difficult to exchange the semiconductor element 1 when it becomes necessary to update the semiconductor element 1 later on.

Figure 3:
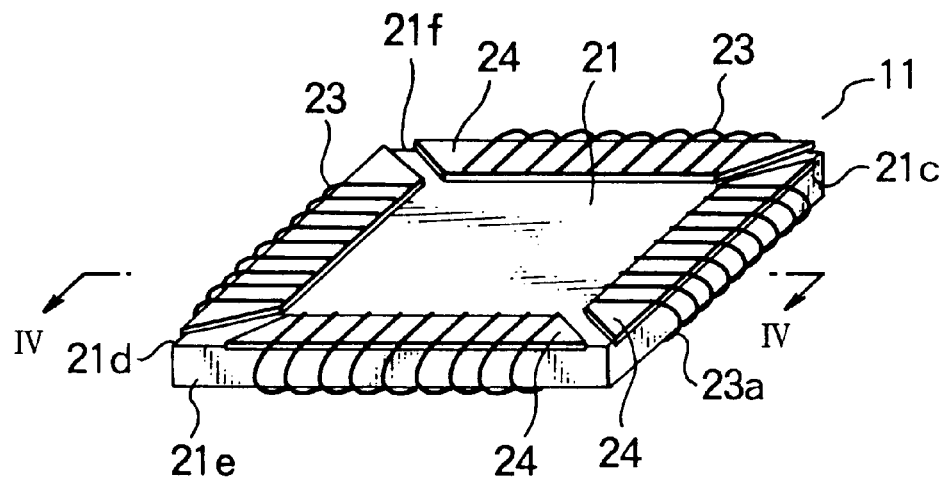
FIG. 3 is a perspective view showing a semiconductor package according to a first embodiment of the present invention.
Figure 4:
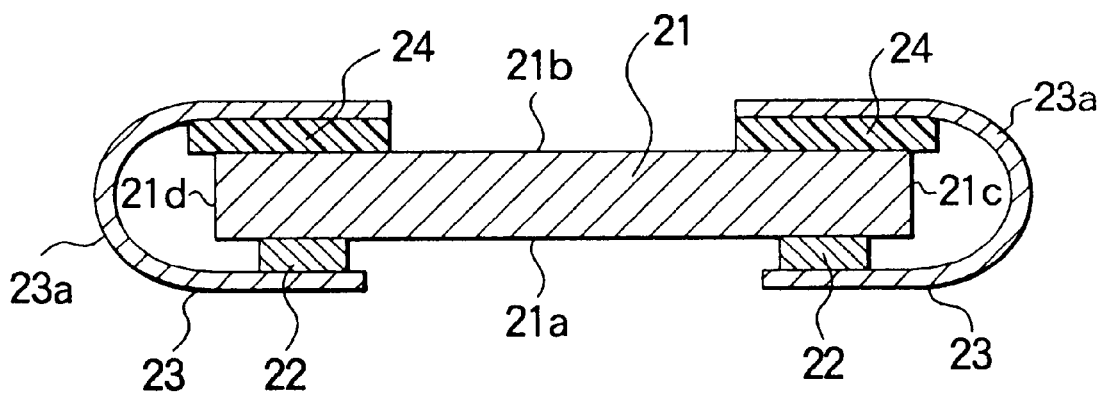
FIG. 4 is a cross-sectional view at the line IV—IV of FIG. 3.

Next, the embodiments of the present invention will be described in detail with reference to the drawings. FIGS. 3 and 4 show a semiconductor package according to a first embodiment of the present invention.

With reference to FIGS. 3 and 4, the semiconductor package 11 includes a semiconductor element 21 as a LSI having a quadrangle plate, an electrode 22 connected to a circuit of the semiconductor element 21 at a first face 21a among the first and second faces 21a, 21b opposite in parallel each other in a direction intersecting at right angle with a plate thickness direction of the semiconductor 21, an insulating film member 24 provided on the second face 21b through the semiconductor 21 as oppose to the electrode 22, and a conductive lead 23 of which the electrode 22 and the film member 24 are connected each other.

The electrode 22 is a part which corresponds to a conductive pad of the semiconductor element 21 or an input/output terminal of the semiconductor element 21. The lead 23 is bent in a side face rough U-shape. The film member 24 is adhered to the second face 21b of the semiconductor element 21 by an adhesive.

In the present embodiment, on each of four perimeter parts of the semiconductor element 21 having a quadrangle, there has four sheets of film members 24, a plurality of electrodes 22, and a plurality of leads 23 of which the film member 24 and the electrode 22 are connected each other.

That is, in the present embodiment, on the first face 21a, each of the one-end parts of nine of the leads 23 in one set on one perimeter part is connected on nine of the electrodes 22 one-by-one. Further, the other-end parts of nine of the leads 23 in one set are connected to one of the film members 24. Accordingly, the other-end parts of nine of the leads 23 in one set are connected to each of the four sheets of film members 24, in one perimeter part.

Each of the electrodes 22 provided on the first surface 21a is located nearby four side faces 21c, 21d, 21e, 21f in parallel to a plate thickness direction of the semiconductor element 11. Also, each of the four film members 24 provided on the second face 21a extends a little bit out of the four side faces 21c, 21d, 21e, 21f in parallel to a plate thickness direction of the semiconductor element 11 from the four perimeter parts.

Each of the leads 23 is connected to the electrode 22 and the film member 24 in such a manner that a middle part thereof is bent as oppose to the side faces 21c, 21d, 21e, 21f. A middle part of each of the leads 23 is bent to extrude outwardly for the side faces 21c, 21d, 21e, 21f, and this bent parts turn to be the terminal parts 23a for use in an input or an output for connecting with a pattern electrode of the circuit board when having been mounted to the circuit board which will be described later.

Further, in the present embodiment, it is described for the semiconductor element 21 having a quadrangle, but it can be applied in the semiconductor element 21 in a shape of other-rectangular, or circle and the like, but not limiting to the semiconductor element 21 having a quadrangle.

Figure 5:
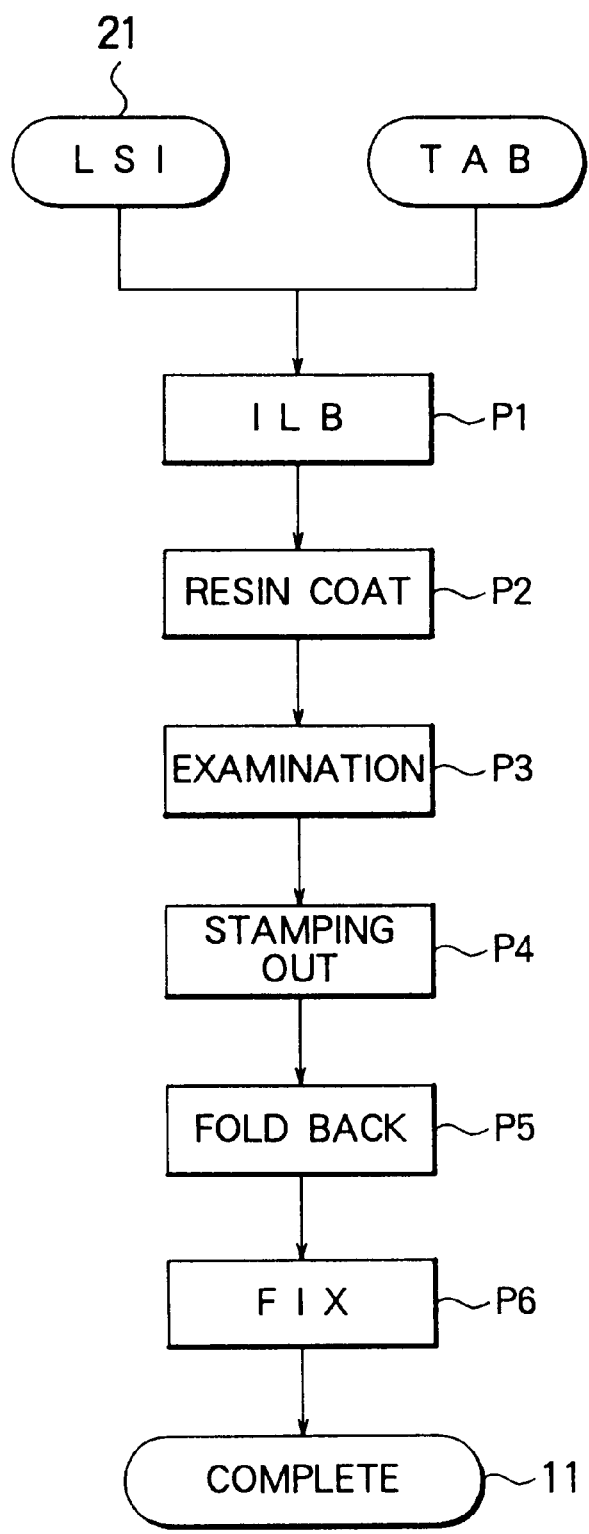
FIG. 5 is a flow chart illustrating an assembly process of the semiconductor package shown in FIG. 1.
Figure 6:
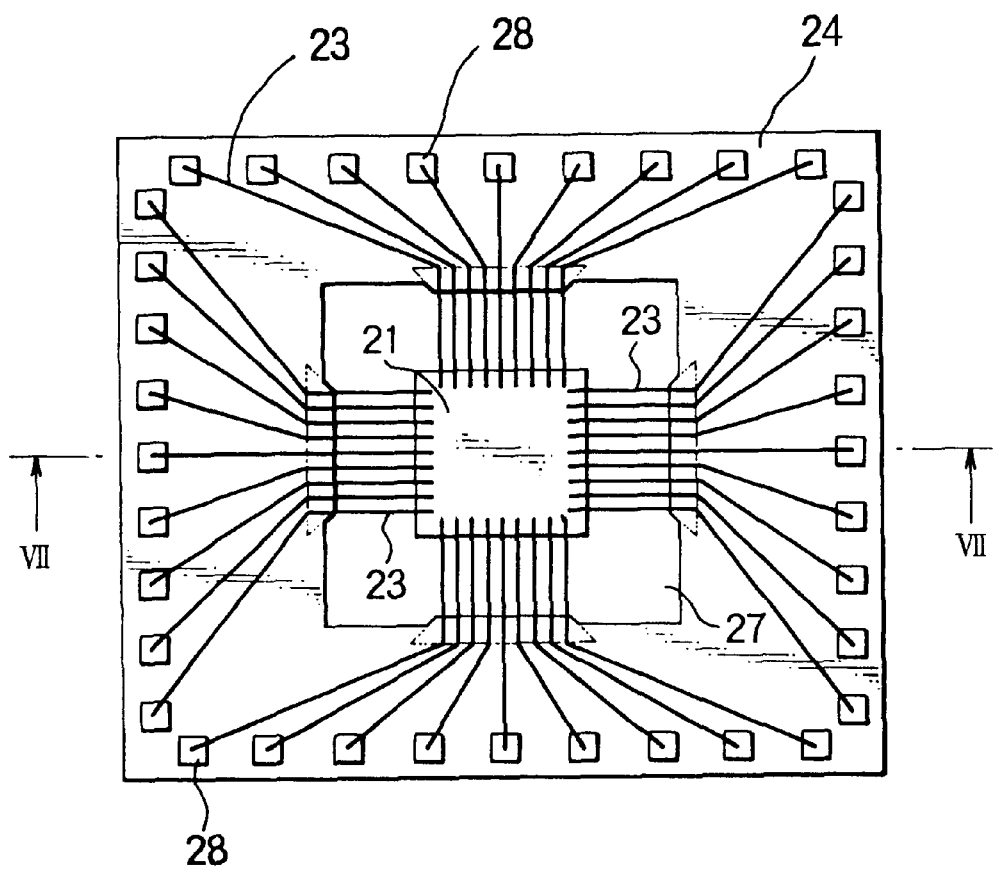
FIG. 6 is a plane view showing a part of an assembly process of the semiconductor package shown in FIG. 1.
Figure 7:
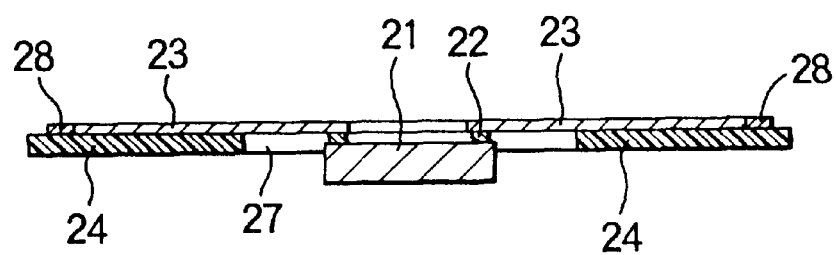
FIG. 7 is a cross-sectional view at the line VII—VII of FIG. 6.

Next, an assembly method of a semiconductor package according to the present invention will be described. FIG. 5 shows a flow of each assembly process of the semiconductor package 11. FIGS. 6 and 7 show a process in the middle of assembling the semiconductor package 11 in a state of being the ILB (Inner Lead Bonding) connected to the semiconductor element 21 shown in FIGS. 3 and 4 by the TAB.

Referring to FIGS. 5 to 7, at first, one-end units of the lead 23 is ILBed to the electrode 22 of the semiconductor element 21 by the TAB which is conventionally carried out (step P1).

In the center of the film member 24, one device hole 27 for mounting the semiconductor 21 is formed. The device hole 27 is formed in a dimension of an external form larger than an external form of the semiconductor 21.

The lead 23 of Cu with a thickness of about 30 micrometers is provided on the film member 24. One-ends units of a plurality of leads 23 extend into the device hole 27. A treatment such as an Au plating or a solder plating has been made on a plating such as Sn plating or Ni plating, on a surface of the lead 23. The one-end units of the plurality of leads 3 extending into the device hole 27 and the plurality of electrodes 22 of the semiconductor element 21 are connected one-by-one. Also, a conductive pad 28 is provided at the other-end unit of the lead 23 on the film member 24.

In this state, as the same as the conventional TAB, it is possible to conduct an examination of the semiconductor package 21 by energizing to a resin coat, or the conductive pad 28, and to make the resin coat (steps P2, P3).

Next, the film member 24 in a state shown in FIG. 6 is cut off at a dotted line part in FIG. 6. That is, the film member 24 is to be cut off by stamping out, in a state of which the leads 23 on the film member 24 is left a little bit from an ambient edge of the device hole 27 (step P4).

Figure 8:
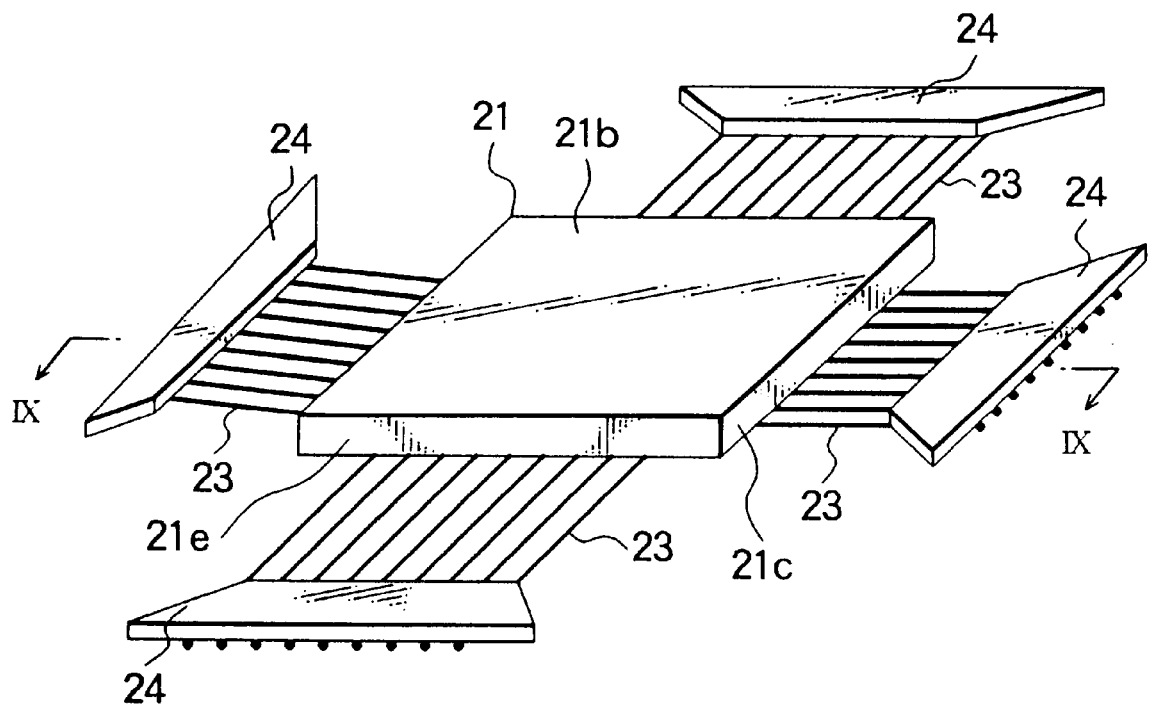
FIG. 8 is a perspective view showing a part of an assembly process of the semiconductor package shown in FIG. 1, and showing a state after a stamp out.
Figure 9:
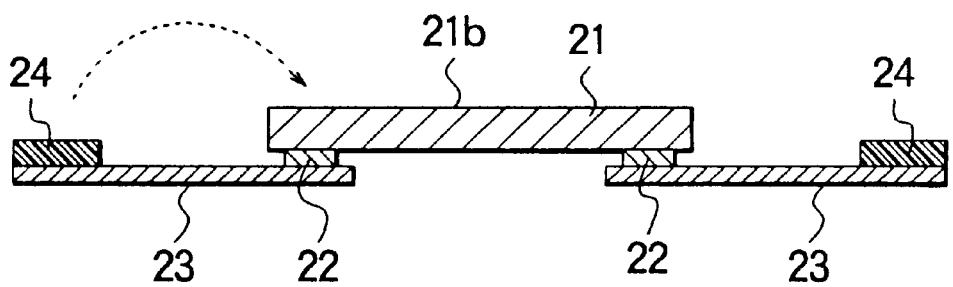
FIG. 9 is a cross-sectional view at the line IX—IX of FIG. 6.

FIGS. 8 and 9 show the state after the film member 24 has been stamped out from the state shown in FIGS. 6 and 7. In this state, differing from the conventional TAB, the leads 23 are connected to the remaining film member 24 after having stamped out.

Next, the leads 23 are bent, and as shown in a dotted arrow of FIG. 9, the remaining film member 24 after having stamped out is folded back to four perimeter units on the second face 21b (step P5). Then, at the end, the film member 24 is fixed on the second face 21b of the semiconductor element 21 using an adhesive (step P6). As described above, the semiconductor package 11 shown in FIGS. 3 and 4 is completed. Further, as an adhesive, an epoxy family or a silicon family is desirable.

The leads 23 of the completed semiconductor package 11 are such that the bent parts thereof located as oppose to four side faces of the semiconductor element 21 turn to be the terminal parts 23a for use in an input/output. This state is the same as the state shown in FIGS. 3 and 4.

Figure 10:
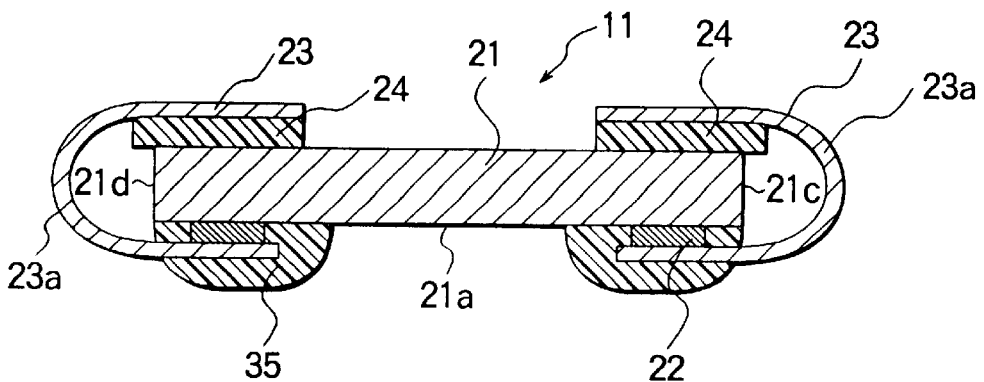
FIG. 10 is a cross-sectional view of a semiconductor package according to a second embodiment of the semiconductor package of the present invention.

FIG. 10 shows a semiconductor package 11 according to a second embodiment of the present invention. Referring to FIG. 10, the semiconductor package 11 in the second embodiment is such that a connection part of the leads 23 and the electrodes 22 is fixed by a resin member 35 so as to reinforce/protect the leads 23 and the electrodes 22 in the semiconductor package 11 of the first embodiment shown in FIG. 4. The resin member 35 covers the leads 23 and the electrodes 22, and are provided on the semiconductor element 21.

Figure 11:
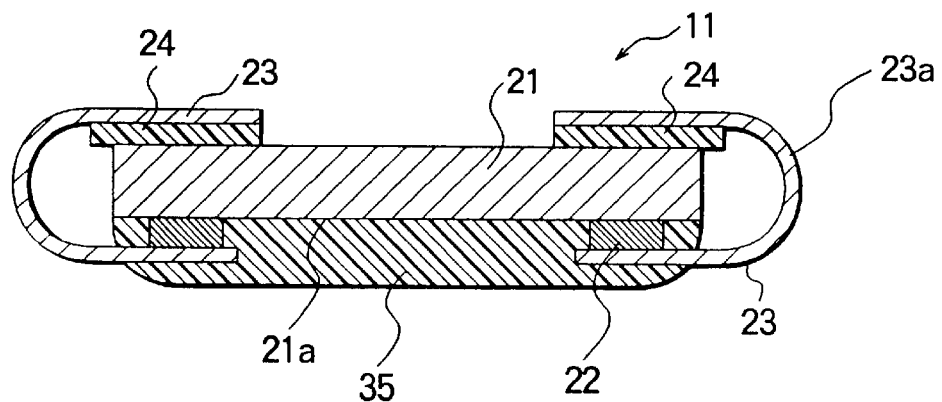
FIG. 11 is a cross-sectional view of a semiconductor package according to a third embodiment of the semiconductor package of the present invention.

FIG. 11 shows a semiconductor package 11 according to a third embodiment of the present invention. Referring to FIG. 11, the semiconductor package 11 in the second embodiment is such that a connection part of the leads 23 and the electrodes 22 is fixed by a resin member 35 so as to reinforce/protect the leads 23 and the electrodes 22 in the semiconductor package 11 of the first embodiment shown in FIG. 4. The resin member 35 covers the leads 23 and the electrodes 22, and are provided on the semiconductor element 21.

Further, a semiconductor package 21 according to a fourth embodiment shown in FIG. 11 is such that not only it provides a resin member 35 just around the electrodes 22 of the semiconductor package 11 according the second embodiment, but also it protects the whole first face 21a of the semiconductor element 21 by the resin member 35.

Moreover, in the second and third embodiments, it is desirable that the resin member 35 is to be an epoxy family. Also, a process of solidifying the resin member 35 would obtain an effect of relieving a stress applied on the connection part of the electrodes 22 and the leads 23, by the bent of leads 23, as implementing before bending the leads 23.

Figure 12:
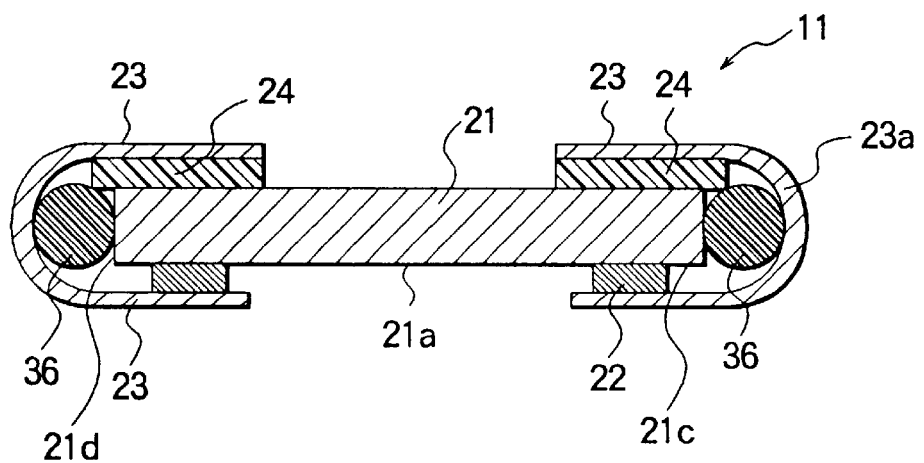
FIG. 12 is a cross-sectional view of a semiconductor package according to a fourth embodiment of the semiconductor package of the present invention.

FIG. 12 shows a semiconductor package 11 according to a fourth embodiment of the present invention. Referring to FIG. 12, the semiconductor package 11 in the fourth embodiment is such that an elastic member 36 having a stick-form is located along each of the side faces 21c, 21d, 21e, 21f of the semiconductor element 21 in the semiconductor package 11 of the first embodiment shown in FIG. 4. The lead 23 is bent in a form to envelope the elastic member 36. By doing so as described above, the lead 23 would obtain an effect of compensating a weakness of an elastic force thereof by the elastic member 36. Still, as the elastic member 36, for example, a silicon resin, a rubber member are desirable.

Figure 13:
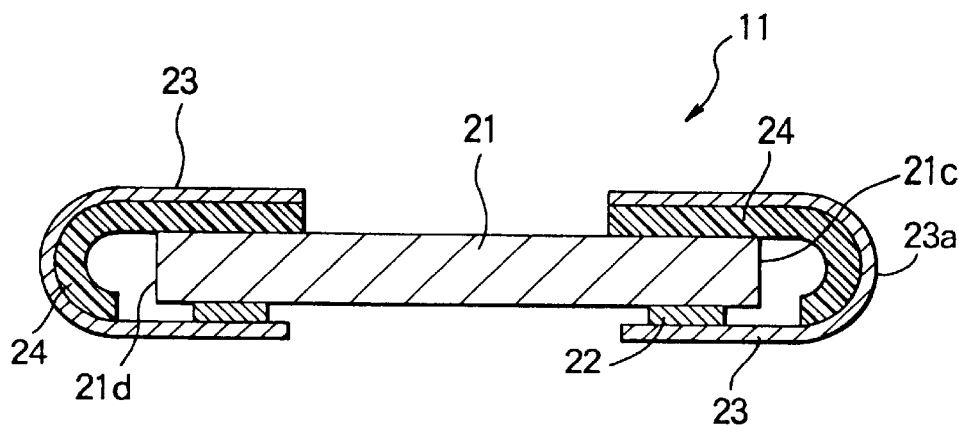
FIG. 13 is a cross-sectional view of a semiconductor package according to a fifth embodiment of the semiconductor package of the present invention.

FIG. 13 shows a semiconductor package 11 according to a fifth embodiment of the present invention. Referring to FIG. 13, the semiconductor package 11 in the fifth embodiment is such that a film member 24 extends to a terminal part 23a of the lead 23 so as to oppose to or face to the side faces 21c, 21d, 21e, 21f of the semiconductor element 21 in the semiconductor package 11 of the first embodiment shown in FIG. 4. A strength of the lead 23 can be compensated by forming the film member 24 as described above.

Figure 14:
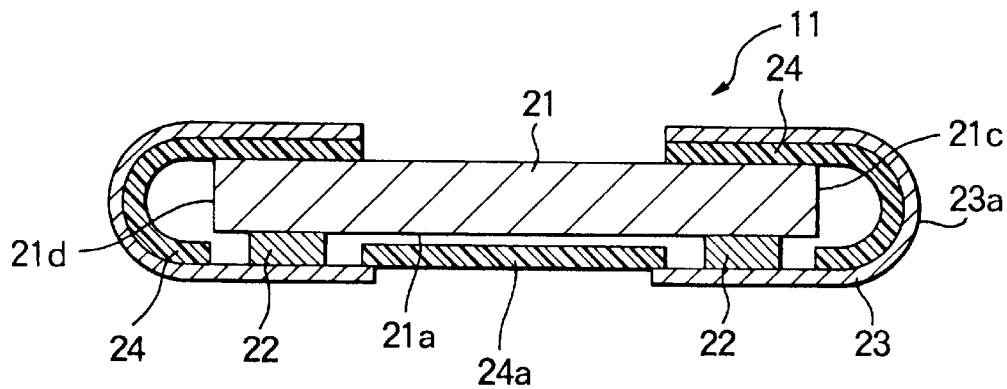
FIG. 14 is a cross-sectional view of a semiconductor package according to a sixth embodiment of the semiconductor package of the present invention.

FIG. 14 shows a semiconductor package 11 according to a sixth embodiment of the present invention. Referring to FIG. 14, the semiconductor package 11 in the sixth embodiment is such that a film member 24 extends to a terminal part 23a of the lead 23 so as to oppose to or face to the side faces 21c, 21d, 21e, 21f of the semiconductor element 21 in the semiconductor package 11 of the first embodiment shown in FIG. 4.

Further, on the first face 21a of the semiconductor element 21, an additional film member 24a is provided. The addition film member 24a opposes to the first face 21a with a predetermined spacing, and is held at one end unit of the lead 23. Moreover, the additional film member 24a uses the same material as the film member 24.

Since the additional film member 24a covers the first face 21a of the semiconductor element 21 with a predetermined spacing, it can protect a circuit of the semiconductor element 21.

Figure 15:
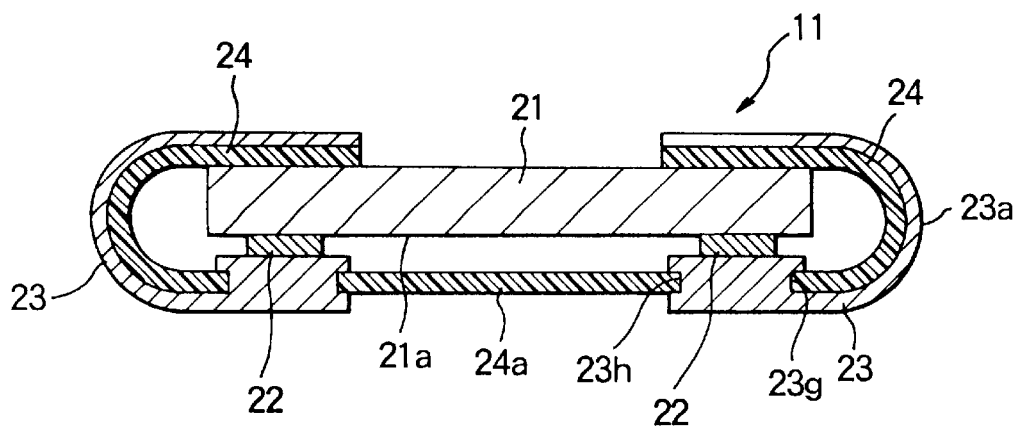
FIG. 15 is a cross-sectional view of a semiconductor package according to a seventh embodiment of the semiconductor package of the present invention.

FIG. 15 shows a semiconductor package 11 according to a seventh embodiment of the present invention. Referring to FIG. 15, the semiconductor package 11 in the sixth embodiment is such that a film member 24 extends to a terminal part 23a of the lead 23 so as to oppose to or face to the side faces 21c, 21d, 21e, 21f of the semiconductor element 21 in the semiconductor package 11 of the first embodiment shown in FIG. 4.

Further, on the first face 21a of the semiconductor element 21, an additional film member 24a held by an end unit of the lead 23 is provided so as to opposes to the first face 21a with a predetermined spacing. The additional film member 24a uses the same material as the film member 24.

The lead groove parts 23g, 23h are formed on one-end unit of the lead on the side connected to the electrode 22 so as to fit the end parts of the film member 24 and the additional film member 24a therein. In the lead groove parts 23g, 23h, the end parts of the film member 24 and the additional film member 24a are held as being put in.

Further, since the additional film member 24a covers the first face 21a of the semiconductor 21 with a predetermined spacing, the circuit of the semiconductor element 21 can be protected.

Figure 16:
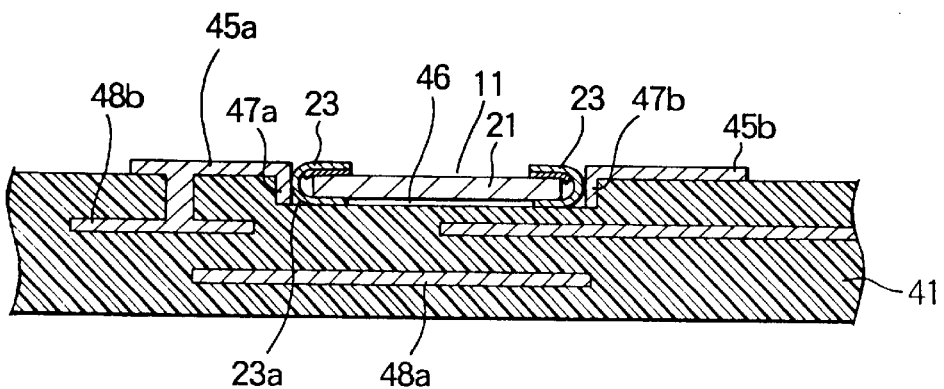
FIG. 16 is a cross-sectional view according to a first embodiment of a semiconductor mounting structure of the present invention.

Next, FIG. 16 shows a first embodiment of a mounting structure of a semiconductor package of the present invention. Further, in the mounting structure of the semiconductor package in the present invention, the semiconductor package 11, and either one of the semiconductor packages 11 described by the first to the seventh embodiments for this semiconductor package 11 would be adopted. Accordingly, for the semiconductor package 11, the semiconductor package 11 described in the first embodiment would be adopted as a representative example, and the description thereof would be omitted by labelling the identical parts with the identical symbols.

With reference to FIG. 16, the mounting structure of the semiconductor package 11 has a circuit board 41 on which the semiconductor package 11 is to be mounted. A plurality of conductive wire patterns 45a, 45b are provided on a surface of this circuit board 41. An accommodation groove part 46 having a dimension of an adequate size for placing the semiconductor package 11 is formed on a surface of the circuit board 41. In the accommodation groove 46, the pattern electrodes 47a, 47b are provided on each of the internal wall faces opposite each other. The pattern electrodes 47a, 47b are respectively connected to the wiring patterns 45a, 45b provided on a surface of the circuit board 41.

The semiconductor package 11 is accommodated in the accommodation groove part 46. In the accommodation groove part 46, a terminal part 23a of the lead 23 is connected between the pattern electrodes 47a, 47b. The semiconductor package 11 is mounted on the circuit board 41, by accommodating the terminal part 23a of the lead 23 as being opposed in the accommodation groove part 46, so as to oppose between the pattern electrodes 47a, 47b.

In the mounting structure of the semiconductor package 11 in this embodiment, as the semiconductor package 11 is mounted in the accommodation groove part 46, an overall thickness dimension after having been mounted can be made as a thin dimension. Further, symbols 48a, 48b in FIG. 16 indicate a conductive inner layer pattern being inner-layered within the circuit board 41.

In a case that it is not required to replace the semiconductor package 11, having mounted the semiconductor package 11 on the circuit board 41, and after having confirmed the operation, the end parts 23a of the leads 23 are soldered to the pattern electrodes 47a, 47b. In this case, having made a solder plating in advance on the pattern electrodes 47a, 47b on the side of the circuit board 41, then a soldering is made on the end of the leads 23 by implementing a reflow.

Figure 17:
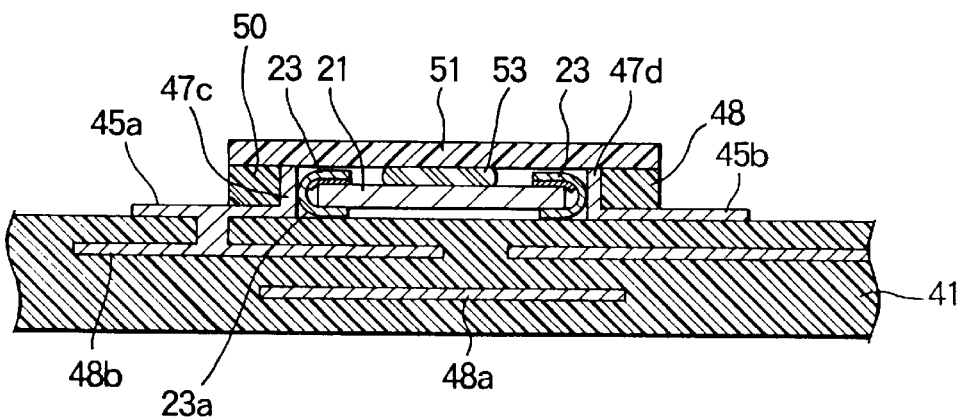
FIG. 17 is a cross-sectional view according to a second embodiment of a semiconductor mounting structure of the present invention.

FIG. 17 shows a second embodiment of a mounting structure of the semiconductor package of the present invention. Further, in the mounting structure of the semiconductor package in the present embodiment, for the semiconductor package 11, either one of the semiconductor packages 11 described by the first to the seventh embodiments would be adopted.

Accordingly, for the semiconductor package 11, the semiconductor package 11 of the first embodiment is adopted as a representative example, and the description will be omitted by labelling the identical parts with the identical symbols.

With reference to FIG. 17, a mounting structure of a semiconductor package has a semiconductor package 11, and a circuit board 41 on which this semiconductor package 11 is mounted. A plurality of conductive wiring patterns 45a, 45b are provided on this circuit board 41. A frame part 48 having a dimension of an adequate size for inserting and placing the semiconductor package 11 therein is provided on a surface of the circuit board 41. In the frame part 48, the pattern electrodes 47c, 47d are provided along each of the inner wall faces which are opposite each other. The pattern electrodes 47c, 47d are respectively connected to the wiring patterns 45a, 45b provided on the surface of the circuit board.

The semiconductor package 11 is accommodated within the frame part 48. In the frame part 48, the leads 23 of the semiconductor package 11 are connected between the pattern electrodes 47c, 47d.

The semiconductor package 11 is mounted on the circuit board 41, by accommodating to the frame part 50 as opposing the terminal part 23a of the leads 13 so as to be opposed between the pattern electrodes 47c, 47d.

In the present embodiment, the circuit board 41 and the semiconductor pattern 11 are electrically connected by only inserting the semiconductor package 11 into the frame part 50. It is desirable for the circuit board 41 and the frame part 50 in this case to use a ceramic substrate or a built-up PWB, for associating to the fine terminal parts 23a.

Further, in the present embodiment, the semiconductor package 11 is hermetic-sealed by providing a lid 51 on the frame part 50.

Also, by standing an additional member 53 having a thermal conductivity and/or a holding force, between the lid 51 and the semiconductor package 11, the semiconductor package 11 is physically held, as well as an action of letting escape a heat of the semiconductor element 21 to the lid 51 can be obtained. As the additional member 53, for example, a resin material such as a silicon resin, or a plate spring and the like would be adopted. Moreover, the symbols 48a, 48b in FIG. 17 indicates the inner layer patterns trimmed within the circuit board 41.

In a case that it is not required to replace the semiconductor package 11, having mounted the semiconductor package 11 on the circuit board 41, and after having confirmed the operation, the end parts of the leads 23 and the pattern electrode 45a are soldered.

Figure 18:
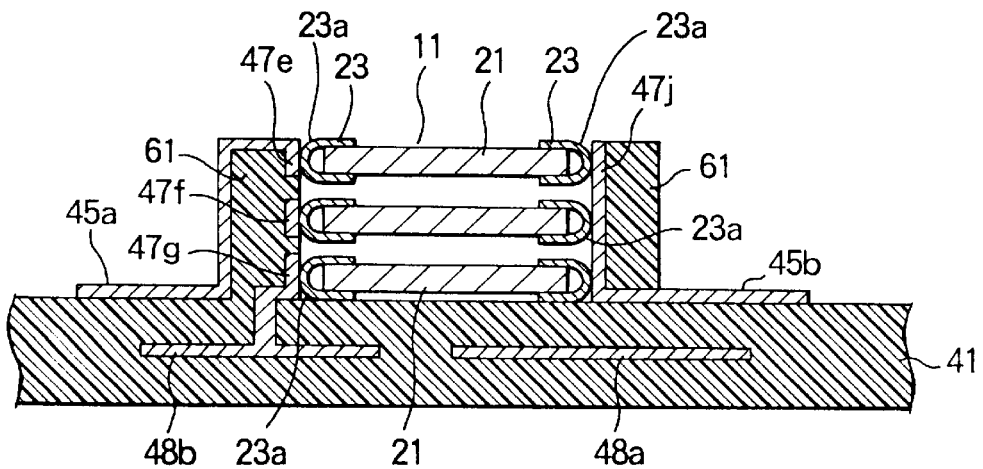
FIG. 18 is a cross-sectional view according to a third embodiment of a semiconductor mounting structure of the present invention.

Next, an application example of the mounting structure of the semiconductor package 11 shown in FIG. 17 will be described with reference to FIG. 18. In the present embodiment, it turns to be a frame part 61 which is provided by further extending the frame part 50 shown in FIG. 17 in a vertical direction on the circuit board 41. The frame part 61 is extended on the circuit board 41 with a long dimension. Within the frame part 61, a plurality of semiconductor packages 11 are mounted as being horizontally laminated with a predetermined spacing. A semiconductor element 21 having many common terminals such as a memory is particularly suitable for the semiconductor package 11 in this case.

Further, the pattern electrodes 47e, 47f, 47g at one side opposing within the frame part 61 are formed as plurals in the up and down directions of the circuit board 41, and the pattern electrode 47j at the other side is formed continuously in the up and down directions of the circuit board 41. The wiring pattern 45a at the one side is connected to the pattern electrode 47e at the top from the upper face of the frame part 61 at the one side, along an external face of the frame part 61 at the one side. Each of the pattern electrodes 47f, 47g located under the pattern electrode 47e at the top is connected to the inner layer pattern 28b, respectively. Each of the pattern electrode 47e, 47f, 47g at the one side is connected to each of the terminal units 23a of the leads 23 at the one side in the plurality of semiconductor packages 11 one-by-one. Further, the pattern electrode 47j at the other side is connected to the terminal part 23a of the lead 23 at the other side in the plurality of semiconductor packages 11.

As described above by each embodiment, according to the semiconductor package 11 of the present invention, an examination is possible in the middle of the process since the TAB technology is applied thereto. As a result of this, it becomes possible to sort the good items, before mounting the semiconductor package 11 on the circuit board 41.

Further, according to the mounting structure of the semiconductor package of the present invention, an attachment and/or a removal of the semiconductor package 11 can be easily implemented. As a result of this, in a case that the defective of the semiconductor package 11 has been found after having mounted the semiconductor package 11 on the circuit board 41, or in a case that a demand of updating the semiconductor package 11 has been occurred, a replacement of the semiconductor package 11 could be made easily and quickly.

Also, a plurality of semiconductor packages 11 can be easily laminated in multi-levels by providing the frame part 61. As a result of this, the plurality of semiconductor packages can be mounted on the circuit board 41 of the same area.

Moreover, in a case that it is not required to replace the semiconductor package 11, having mounted the semiconductor package 11 on the circuit board 41, and after having confirmed the operation, the end parts of the leads 23 can be soldered to the pattern electrodes 47a, 47b, and thus a connection reliability can be enhanced, while maintaining a springness thereof for a long period of time.

What is claimed is:

1. A method of manufacturing a semiconductor package, comprising:
    preparing a semiconductor element having an electronic circuit, said semiconductor element having a first face, a second face opposite said first face and a side face extending between said first face and said second face, said semiconductor element having on said first face a plurality of predetermined areas serving as electrode interfaces for said electronic circuit;
    preparing a nonconductive film member having mounted thereon a plurality of conductive leads corresponding to said plurality of electrode interface areas;
    positioning said nonconductive film adjacent to said semiconductor element such that said electrode areas align with said corresponding conductive leads;
    forming an electrode connection between said electrode areas and said conductive
    severing said nonconductive film and said conductive leads such that remaining segments of said nonconductive film form a pattern fitting around the periphery of said second face of said semiconductor element;
    bending said conductive leads around said side face of said semiconductor element to make said remaining nonconductive film segments face said second face such that said segments fit around the periphery of said second face of said semiconductor element; and
    affixing said remaining nonconductive film segments to said second face.

2. A method as claimed in claim 1, further comprising forming a resin member before the bending to cover a connection part in which said electrode and said lead are connected to each other.

3. The method of claim 1, wherein said affixing said remaining nonconductive film segments comprises application of an adhesive between said second face and said remaining nonconductive film segments.

4. The method of claim 1, further comprising:
    testing said electronic circuit before severing said nonconductive film, using said conductive leads as a circuit interface.

5. The method of claim 1, further comprising:
    adding a resin to at least a portion of said first face after said forming of an electrode connection.

6. The method of claim 1; further comprising:
    inserting an elastic member along said side face of said semiconductor element before said bending said conductive leads around said side face of said semiconductor element.

7. The method of claim 1, further comprising:
    applying an additional section of said nonconductive film to said first face of said semiconductor element as a protective covering of said electronic circuit.

8. The method of claim 5, wherein said added resin on said first face completely covers said first face.

9. A method of manufacturing a semiconductor package, comprising:
    preparing a semiconductor element containing an electronic circuit, said semiconductor element having a first face, a second face opposite said first face and a side face extending between said first face and said second face, said semiconductor element having on said first face a plurality of predetermined areas serving as electrode interfaces for said electronic circuit;
    preparing a nonconductive film member having mounted thereon a plurality of conductive leads corresponding to said plurality of electrode interface areas;
    positioning said nonconductive film adjacent to said semiconductor element such that said electrode areas align with said corresponding conductive leads;
    forming an electrode connection between said electrode areas and said conductive leads;
    severing said nonconductive film and said conductive leads such that remaining attached segments of said nonconductive film form a pattern to permit said remaining attached segments to fit around the periphery of said second face of said semiconductor element without overlapping each other;
    bending said conductive leads around said side face of said semiconductor element to make said remaining nonconductive film segments face said second face such that said segments fit around the periphery of said second face of said semiconductor element; and
    affixing said remaining attached segments to said second face in such manner that said electrode attachment to said first face and said affixing to said second face remains effective independent of external support.

10. The method of claim 9, wherein said affixing said remaining nonconductive film segments comprises application of an adhesive between said second face and said remaining nonconductive film segments.

11. The method of claim 9, further comprising:
    testing said electronic circuit before severing said nonconductive film, using said conductive leads as a circuit interface.

12. The method of claim 9, further comprising:
adding a resin to at least a portion of said first face after said forming of an electrode connection.

13. The method of claim 9, further comprising:
inserting an elastic member along said side face of said semiconductor element before said bending said conductive leads around said side face of said semiconductor element.

14. The method of claim 9, further comprising:
applying an additional section of said nonconductive film to said first face of said semiconductor element as a protective cover for said electronic circuit.

15. A method of manufacturing a semiconductor package, comprising:
preparing a semiconductor element containing an electronic circuit, said semiconductor element having a first face, a second face opposite said first face and a side face extending between said first face and said second face, said semiconductor element having on said first face a plurality of predetermined areas serving as electrode interfaces for said electronic circuit;
preparing a nonconductive film member having mounted thereon a plurality of conductive leads corresponding to said plurality of electrode interface areas, said nonconductive film member having a device opening of dimensions to accommodate said semiconductor element, said conductive leads protruding unsupported by said nonconductive film member into said device opening by a distance sufficient to permit said unsupported conductive leads to be exposed when wrapped around said side face of said semiconductor element;
positioning said nonconductive film adjacent to said semiconductor element such that said electrode interface areas align with said protruding conductive leads;
forming an electrode connection between said electrode areas and said conductive leads;
severing said nonconductive film and said conductive leads such that remaining attached segments of said nonconductive film form a pattern to permit said remaining attached segments to fit around the periphery of said second face of said semiconductor element;
bending said conductive leads around said side face of said semiconductor element to make said remaining nonconductive film segments face said second face such that said segments fit around the periphery of said second face of said semiconductor element.; and
affixing said remaining attached segments to said second face in such manner that said electrode attachment to said first face and said affixing to said second face remains effective independent of external support.

16. The method of claim 15, wherein said affixing said remaining nonconductive film segments comprises application of an adhesive between said second face and said remaining nonconductive film segments.

17. The method of claim 15, further comprising:
testing said electronic circuit before severing said nonconductive film, using said conductive leads as a circuit interface.

18. The method of claim 15, further comprising:
adding a resin to said first face after said forming of an electrode connection.

19. The method of claim 15, further comprising:
inserting an elastic member along said side face of said semiconductor element before said bending said conductive leads around said side face of said semiconductor element.

20. The method of claim 18, wherein said added resin on said first face completely covers said first face.

* * * * *